(12) United States Patent
Lee et al.

(10) Patent No.: US 10,096,542 B2
(45) Date of Patent: Oct. 9, 2018

(54) SUBSTRATE, SEMICONDUCTOR PACKAGE STRUCTURE AND MANUFACTURING PROCESS

(71) Applicant: Advanced Semiconductor Engineering, Inc., Kaohsiung (TW)

(72) Inventors: Chih Cheng Lee, Kaohsiung (TW); Yuan-Chang Su, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/439,752

(22) Filed: Feb. 22, 2017

(65) Prior Publication Data
US 2018/0240743 A1    Aug. 23, 2018

(51) Int. Cl.
*H01L 23/498*    (2006.01)
*H01L 23/31*    (2006.01)
(Continued)

(52) U.S. Cl.
CPC ...... *H01L 23/49838* (2013.01); *H01L 21/486* (2013.01); *H01L 21/4857* (2013.01); *H01L 21/6835* (2013.01); *H01L 23/3128* (2013.01); *H01L 23/49822* (2013.01); *H01L 23/49827* (2013.01); *H01L 23/49894* (2013.01); *H01L 24/17* (2013.01); *H01L 2221/68345* (2013.01); *H01L 2221/68359* (2013.01); *H01L 2224/16113* (2013.01); *H01L 2224/16227* (2013.01); *H01L 2924/0665* (2013.01); *H01L 2924/07025* (2013.01); *H01L 2924/1579* (2013.01); *H01L 2924/15311* (2013.01); *H01L 2924/15747* (2013.01); *H01L 2924/186* (2013.01)

(58) Field of Classification Search
CPC ......... H01L 23/49838; H01L 23/49827; H01L 23/49894; H01L 21/486; H01L 23/3128; H01L 21/6835; H01L 21/4857; H01L 23/49822; H01L 24/17; H01L 2924/1579; H01L 2224/16113; H01L 2924/186; H01L 2924/15747; H01L 2221/68345; H01L 2924/15311; H01L 2224/16227; H01L 2221/68359; H01L 2924/0665; H01L 2924/07025
USPC ........................................................ 257/773
See application file for complete search history.

(56) References Cited

U.S. PATENT DOCUMENTS

| 9,006,103 B2 | 4/2015 | Kobayashi et al. |
| 9,728,453 B2 * | 8/2017 | Tseng ................ H01L 21/76895 |
| 2014/0034359 A1 | 2/2014 | Lee et al. |

* cited by examiner

*Primary Examiner* — Caleen Sullivan
(74) *Attorney, Agent, or Firm* — Foley & Lardner LLP; Cliff Z. Liu

(57) ABSTRACT

A substrate includes a first dielectric structure, a first circuit layer, a second dielectric structure and a second circuit layer. The first circuit layer is embedded in the first dielectric structure, and does not protrude from a first surface of the first dielectric structure. The second dielectric structure is disposed on the first surface of the first dielectric structure. The second circuit layer is embedded in the second dielectric structure, and is electrically connected to the first circuit layer. A first surface of the second circuit layer is substantially coplanar with a first surface of the second dielectric structure, and a surface roughness value of a first surface of the first circuit layer is different from a surface roughness value of the first surface of the second circuit layer.

21 Claims, 14 Drawing Sheets

(51) Int. Cl.
*H01L 21/48* (2006.01)
*H01L 21/683* (2006.01)
*H01L 23/00* (2006.01)

SUBSTRATE, SEMICONDUCTOR PACKAGE STRUCTURE AND MANUFACTURING PROCESS

BACKGROUND

1. Field of the Disclosure

The present disclosure relates to the field of substrates, semiconductor package structures and manufacturing processes, and more particularly, to an embedded trace substrate, semiconductor package structure including the same and manufacturing process for manufacturing the same.

2. Description of the Related Art

Along with the rapid development of electronic industries and the progress of semiconductor processing technologies, semiconductor chips are integrated with more electronic components to achieve better electrical performance. Accordingly, the semiconductor chips are provided with more input/output (I/O) connections. To manufacture semiconductor packages including semiconductor chips including an increased number of I/O connections, sizes of the semiconductor chips and the semiconductor packages may correspondingly increase. Thus, a manufacturing cost may correspondingly increase. Alternatively, to minimize sizes of semiconductor packages including semiconductor chips including an increased number of I/O connections, a bonding pad density of semiconductor substrates used for carrying the semiconductor chips should correspondingly increase.

SUMMARY

In some embodiments, a substrate includes a first dielectric structure, a first circuit layer, a second dielectric structure and a second circuit layer. The first circuit layer is embedded in the first dielectric structure, and does not protrude from a first surface of the first dielectric structure. The second dielectric structure is disposed on the first surface of the first dielectric structure. The second circuit layer is embedded in the second dielectric structure, and is electrically connected to the first circuit layer. A first surface of the second circuit layer is substantially coplanar with a first surface of the second dielectric structure, and a surface roughness value of a first surface of the first circuit layer is different from a surface roughness value of the first surface of the second circuit layer.

In some embodiments, a semiconductor package structure includes a substrate, a semiconductor die and an encapsulant. The substrate includes a first dielectric structure, a first circuit layer, a second dielectric structure and a second circuit layer. The first circuit layer is embedded in the first dielectric structure, and does not protrude from a first surface of the first dielectric structure. The second dielectric structure is disposed on the first surface of the first dielectric layer. The second circuit layer is embedded in the second dielectric layer, and is electrically connected to the first circuit layer. A first surface of the second circuit layer is substantially coplanar with a first surface of the second dielectric structure, and a surface roughness value of a first surface of the first circuit layer is different from a surface roughness value of the first surface of the second circuit layer. The semiconductor die is electrically connected to the second circuit layer. The encapsulant covers the semiconductor die and a surface of the substrate.

In some embodiments, a method of manufacturing includes: (a) providing a wiring structure, wherein the wiring structure comprises a first dielectric structure and a first circuit layer; (b) disposing a second dielectric structure on the wiring structure; (c) disposing a plurality of openings on a first surface of the second dielectric structure; (d) disposing a conductive material on the first surface and the openings of the second dielectric structure; and (e) electrolytic etching the conductive material on the first surface of the second dielectric structure to form a second circuit layer embedded in the second dielectric structure.

DETAILED DESCRIPTION

Figure 1:
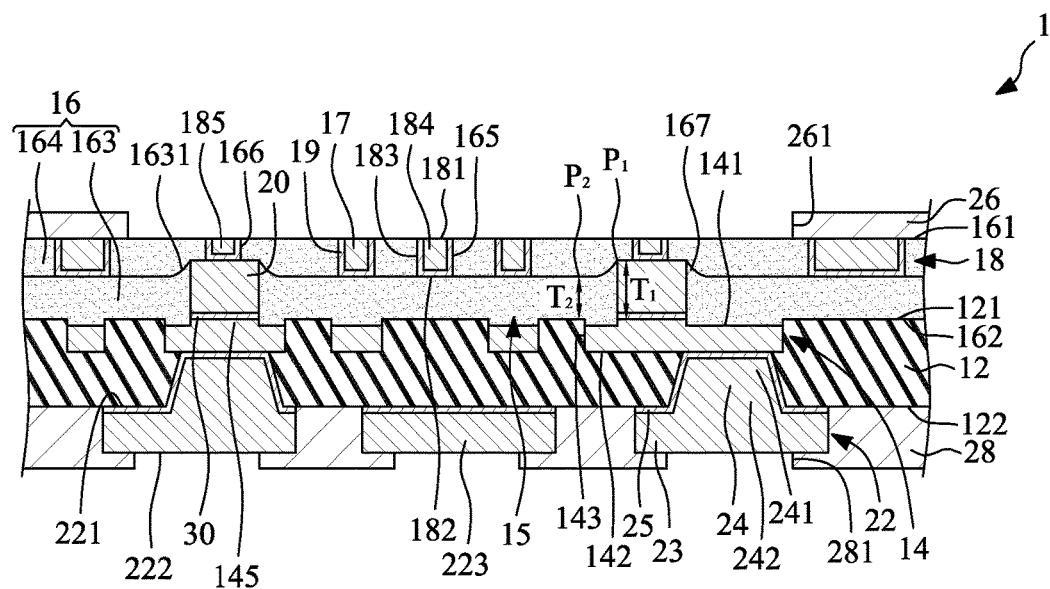
FIG. 1 illustrates a cross-sectional view of a substrate according to some embodiments of the present disclosure.

A semiconductor substrate used for carrying semiconductor chips may be an embedded trace substrate (ETS), which includes two dielectric layers and three circuit layers therebetween. Each of the two dielectric layers is formed from a cured glass fiber reinforced resin (e.g., prepreg). A middle circuit layer (e.g., a first circuit layer) of the three circuit layers is formed by a semi-additive process (SAP) or a modified semi-additive process (MSAP). However, a line width/line space (L/S) of the second circuit layer may not be reduced efficiently.

In the SAP or MSAP, a sidewall of the middle circuit layer (or first circuit layer) may be etched, which results in an imprecise width of the middle circuit layer (or the first circuit layer). To address such a concern, an etching compensation may be used during formations of openings in a dry film. However, the etching compensation still may not completely cure the imprecise width. In addition, a narrow width of traces of the middle circuit layer (or first circuit layer) may cause the traces to be peeled off easily, which reduces a yield rate of the semiconductor substrate.

A top circuit layer (e.g., a second circuit layer) of the three circuit layers is formed by removing a metal material plated on a top surface of a top dielectric layer so that the top circuit layer (e.g., the second circuit layer) is embedded in the top dielectric layer and exposed from the top surface of the top dielectric layer. The removing method may include wet etching and grinding. The wet etching process may be performed by an etching agent, and the grinding process may be performed by a grinding pad and a grinding slurry. In order to ensure that all the metal material plated on the top surface of the top dielectric layer is removed, a top portion of a metal material of the top circuit layer (e.g., the second circuit layer) may also be removed. However, if the thickness of the top circuit layer (e.g., the second circuit layer) is small (e.g., 5 micrometers (μm)) and excess amounts of the metal material of the top circuit layer (e.g., the second circuit layer) is removed, the thickness of the top circuit layer (e.g., the second circuit layer) may be too thin, thus, the transmission of the electrical signals may be influenced. In addition, some of the top circuit layer (e.g., the second circuit layer) may be removed completely, which results in an open circuit. In addition, the grinding process may result in uneven thickness of the top circuit layer (e.g., the second circuit layer).

To address the above concerns, the present disclosure provides an improved semiconductor substrate and improved techniques for manufacturing the semiconductor substrate. In one or more embodiments of the present disclosure, at least one photoimageable dielectric (PID) material replaces the prepreg material for the top dielectric layer (e.g., a second dielectric structure). Furthermore, the pattern (e.g., the openings) of the second dielectric structure is formed by exposure, which results in a more precise width (e.g., using no etching compensation) and more flexibility in pattern design. Thus, the second circuit layer in the pattern includes fine lines, and is available for fine I/O pitch and more I/O connections, especially when an L/S is less than about 7 μm/about 7 μm. In one or more embodiments of the present disclosure, the second circuit layer may be formed by electrolytic etching, thus, there may be no excess amount of the second circuit layer to be removed, and a surface roughness value of a first surface of the first circuit layer is different from a surface roughness value of a first surface of the second circuit layer.

FIG. 1 illustrates a cross-sectional view of a substrate 1 according to some embodiments of the present disclosure. The substrate 1 may be a semiconductor substrate or a package substrate, and includes a first dielectric structure 12, a first circuit layer 14, a second dielectric structure 16, a second circuit layer 18, a plurality of conductive pillars 20, a third circuit layer 22, a plurality of conductive vias 24, a first protection layer 26 and a second protection layer 28.

The first dielectric structure 12 may be a dielectric layer which may be, or may include, for example, a monocrystalline silicon, a polycrystalline silicon, an amorphous silicon, other suitable materials, or a combination thereof. The first dielectric structure 12 may be, or may include, for example, a sheet made from pre-impregnated composite fibers. For example, the first dielectric structure 12 may include a cured fiber reinforced resin. A thickness of the first dielectric structure 12 may be, for example, about 40 μm. The first dielectric structure 12 includes a first surface 121 and a second surface 122 opposite to the first surface 121. It is noted that the first dielectric structure 12 may include, or be formed from, a cured PID material such as epoxy or polyimide (PI) including photoinitiators.

The first circuit layer 14 is embedded in the first dielectric structure 12, and includes a first surface 141, a second surface 142 opposite to the first surface 141, and a side surface 143 extending between the first surface 141 and the second surface 142. A material of the first circuit layer 14 may be a conductive first metal such as copper, and a thickness thereof may be greater than about 10 μm (for example about 15 μm). A portion (e.g., the first surface 141) of the first circuit layer 14 is exposed from the first surface 121 of the first dielectric structure 12. For example, the first dielectric structure 12 does not cover the first surface 141 of the first circuit layer 14. The first circuit layer 14 does not protrude from the first surface 121 of the first dielectric structure 12. In some embodiments, the first circuit layer 14 is recessed from the first surface 121 of the first dielectric structure 12, and a distance may be formed between the first surface 141 of the first circuit layer 14 and the first surface 121 of the first dielectric structure 12, so that a recess portion 15 is formed above the first surface 141 of the first circuit layer 14 and under the first surface 121 of the first dielectric structure 12. However, some embodiments, the first surface 141 of the first circuit layer 14 may be coplanar with the first surface 121 of the first dielectric structure 12. In addition, a surface roughness value (e.g., in terms of root mean square surface roughness) of the first surface 141 of the first circuit layer 14 may be greater than about 0.4 μm, a surface roughness value of the side surface 143 of the first circuit layer 14 may be in a range of about 0.25 μm to about 0.5 and an L/S of the first circuit layer 14 may be greater than about 7 μm/about 7 μm.

The second dielectric structure 16 is disposed on the first surface 121 of the first dielectric structure 12. The second dielectric structure 16 may include, or be formed from, a cured PID material such as epoxy or PI including photoinitiators, and a thickness thereof may be greater than about 15 The second dielectric structure 16 includes a first surface 161 and a second surface 162 opposite to the first surface 161. In some embodiments, the second dielectric structure 16 may be a double layer structure which includes a first dielectric layer 163 disposed on the first dielectric structure 12, and a second dielectric layer 164 disposed on the first dielectric layer 163. In some embodiments, the material of the first dielectric layer 163 may be the same as the material of the second dielectric layer 164, but the first dielectric layer 163 and the second dielectric layer 164 may be formed at different times. Thus, there may be an interface (e.g., a first surface 1631 of the first dielectric layer 163) between the first dielectric layer 163 and the second dielectric layer 164. In some embodiments, the material of the first dielectric layer 163 may be different from the material of the second dielectric layer 164. As shown in FIG. 1, a portion of the second dielectric structure 16 (e.g., the first dielectric layer 163) extends into the recess portion 15 above the first surface 141 of the first circuit layer 14.

The second circuit layer 18 is embedded in the second dielectric structure 16, and includes a first surface 181, a second surface 182 opposite to the first surface 181 and a side surface 183 extending between the first surface 181 and the second surface 182. A material of the second circuit layer 18 may include a conductive second metal 17 such as copper, and a thickness thereof may be, for example, less than about 5 In some embodiments, a thickness of the second circuit layer 18 is substantially equal to a thickness of the second dielectric layer 164 of the second dielectric structure 16. For example, the second circuit layer 18 extends through the second dielectric layer 164 of the second dielectric structure 16. Thus, the first surface 181 of the second circuit layer 18 is exposed from the first surface 161 of the second dielectric structure 16 (e.g., the top surface of the second dielectric layer 164). For example, the second dielectric structure 16 may not cover the first surface 181 of the second circuit layer 18, and the first surface 181 of the second circuit layer 18 may be substantially coplanar with the first surface 161 of the second dielectric structure 16 (e.g., the top surface of the second dielectric layer 164). The second circuit layer 18 is electrically connected to the first circuit layer 14 through the conductive pillars 20.

In addition, a surface roughness value of the first surface 181 of the second circuit layer 18 may be, for example, in a range of about 0.2 µm to about 0.4 µm, a surface roughness value of the side surface 183 of the second circuit layer 18 may be less than or equal to about 0.1 µm, and an L/S of the second circuit layer 18 may be less than about 7 µm/about 7 µm (e.g., in a range of about 2 µm/about 2 µm to about 5 µm/about 5 µm). The surface roughness values of the first surface 141 and the side surface 143 of the first circuit layer 14 may be different from the surface roughness values of the first surface 181 and the side surface 183 of the second circuit layer 18, respectively, because the first circuit layer 14 and the second circuit layer 18 may be formed by different processes. For example, the side surface 143 of the first circuit layer 14 may be treated with a brown oxide treatment to facilitate a lamination process of the first dielectric structure 12, the first surface 141 of the first circuit layer 14 may be formed by wet etching, and the first surface 181 of the second circuit layer 18 may be formed by electrolytic etching. Therefore, the surface roughness value of the first surface 141 of the first circuit layer 14 may be greater than the surface roughness value of the first surface 181 of the second circuit layer 18, and the surface roughness value of the side surface 143 of the first circuit layer 14 may be greater than the surface roughness value of the side surface 183 of the second circuit layer 18. In some embodiments, the second circuit layer 18 having fine pitch (e.g., an L/S of the second circuit layer 18 is less than about 7 µm/about 7 µm) is embedded in the second dielectric structure 16, and thus, the second circuit layer 18 may not peel off from the second dielectric structure 16 easily. In some embodiments, a circuit layer having fine pitch (e.g., an L/S of the circuit layer is less than about 7 µm/about 7 µm) may stand on a dielectric structure (e.g., the circuit layer may be disposed on a surface of the dielectric structure), and thus, the circuit layer may peel off from the dielectric structure easily.

In some embodiments, the second dielectric structure 16 defines a second pattern including a plurality of first openings 165 and a plurality of second openings 166. The first openings 165 and the second openings 166 extend through the second dielectric layer 164 of the second dielectric structure 16. The second circuit layer 18 includes a plurality of conductive traces 184 disposed in the first openings 165 and a plurality of conductive posts 185 disposed in the second openings 166. The conductive traces 184 and the conductive posts 185 are exposed from the first surface 161 of the second dielectric structure 16, and a thickness of the conductive trace 184 is greater than a thickness of the conductive post 185. Each of the conductive posts 185 is disposed on a respective one of the conductive pillars 20.

The second circuit layer 18 includes the second metal 17 and a second seed layer 19. A portion of the second seed layer 19 is interposed between the second metal 17 and the second dielectric layer 164 of the second dielectric structure 16, and another portion of the second seed layer 19 is interposed between the second metal 17 and the first dielectric layer 163 of the second dielectric structure 16. For example, a portion of the second seed layer 19 is disposed on a sidewall of the second metal 17. In other words, for example, a portion of the second seed layer 19 is disposed on the sidewalls of the first openings 165 and the second openings 166 of the second pattern of the second dielectric structure 16.

The conductive pillars 20 are embedded in the second dielectric structure 16, and each of the conductive pillars 20 electrically connects and/or physically connects the first circuit layer 14 to the second circuit layer 18. In some embodiments, the conductive pillars 20 extend through the first dielectric layer 163 of the second dielectric structure 16, and are exposed from the first surface 1631 of the first dielectric layer 163. Thus, each of the conductive pillars 20 electrically connects and/or physically connects the first circuit layer 14 to a respective one of the conductive posts 185 of the second circuit layer 18. The conductive pillar 20 may have a substantially consistent width which may be, for example, in a range from about 25 µm to about 30 µm, which may be greater than a width of the conductive post 185. As shown in FIG. 1, the first circuit layer 14 may further include a plurality of protrusion portions 145 protruding from the first surface 141 thereof and corresponding to the conductive pillars 20. An intermediate layer 30 is optionally interposed between the protrusion portion 145 and the conductive pillar 20. A bottom surface of the intermediate layer 30 is substantially coplanar with the first surface 121 of the first dielectric structure 12. The widths of the conductive pillar 20, the intermediate layer 30 and the protrusion portion 145 are substantially equal to each other so as to form a pillar structure. The intermediate layer 30 may be a seed layer formed from a portion of a copper foil.

In some embodiments, the first dielectric layer 163 has a first thickness $T_1$ at a first position $P_1$ and a second thickness $T_2$ at a second position $P_2$. The first position $P_1$ is closer to the conductive pillar 20 than the second position $P_2$, and the first thickness $T_1$ is greater than the second thickness $T_2$. For example, $T_1$ may be greater than about 1.1 times $T_2$ (e.g., about 1.2 times or more greater or about 1.3 times or more greater). Thus, the first dielectric layer 163 includes a plurality of protrusion portions 167, and each of the protrusion portions 167 surrounds a respective one of the conductive pillars 20. A thickness of the protrusion portion 167 decreases with increasing distance from the conductive pillar 20.

The third circuit layer 22 is disposed on the second surface 122 of the first dielectric structure 12, and includes a first surface 221 and a second surface 222 opposite to the first surface 221. A material of the third circuit layer 22 may be a conductive third metal 23 such as copper, and the thickness thereof may be, for example, about 15 µm. The third circuit layer 22 is electrically connected to the first circuit layer 14 through conductive vias 24. A portion of the third circuit layer 22 is for external connection. The third circuit layer 22 includes the conductive third metal 23 and a third seed layer 25. A portion of the third seed layer 25 is interposed between the third metal 23 and the second surface 122 of the first dielectric structure 12.

The conductive vias 24 are embedded in the first dielectric structure 12. Each of the conductive vias 24 includes a first portion 241 connecting the first circuit layer 14 and a second portion 242 connecting the third circuit layer 22. A width of the first portion 241 of the conductive via 24 is less than a width of the second portion 242 of the conductive via 24. Furthermore, the width of the first portion 241 of the conductive via 24 and/or the width of the second portion 242 of the conductive via 24 may be greater than the width of the conductive pillar 20. In one or more embodiments, the conductive vias 24 and the third circuit layer 22 are formed integrally with each other (e.g., formed concurrently with each other). For example, as shown in FIG. 1, the conductive via 24 includes the third metal 23 and the third seed layer 25.

The first protection layer 26 is disposed on the first surface 161 of the second dielectric structure 16 and the first surface 181 of the second circuit layer 18, and defines at least one opening 261 to expose a portion of the second circuit layer 18 for external connection. For example, the opening 261 may expose the conductive trace 184 and/or the conductive post 185 of the second circuit layer 18. A material of the first protection layer 26 may be a solder mask. The second protection layer 28 is disposed on the second surface 122 of the first dielectric structure 12, and covers a portion or portions of the third circuit layer 22. The second protection layer 28 defines at least one opening 281 to expose one or more portions of the third circuit layer 22 for external connection. For example, the at least one opening 281 may expose a ball pad 223 of the third circuit layer 22. A material of the second protection layer 28 may be a solder mask.

In some embodiments, a material of the second dielectric structure 16 is different from a material of the first dielectric structure 12. An L/S of the second circuit layer 18 may be less than or equal to an L/S of the first circuit layer 14, and the L/S of the first circuit layer 14 may be less than an L/S of the third circuit layer 22. For example, the L/S of the second circuit layer 18 may be less than about 7 μm/about 7 μm (e.g., in a range of about 2 μm/about 2 μm to about 5 μm/about 5 μm), and the L/S of the third circuit layer 22 may be greater than about 20 μm/about 20 μm or about 50 μm/about 50 μm. Thus, the second circuit layer 18 may be used to be electrically connected to a semiconductor chip, and may be referred to as "chip side". The third circuit layer 22 may be used to be mounted to a plurality of solder balls so as to connect to a motherboard, and may be referred to as "ball side".

In a comparative substrate, a fine line structure (e.g., where an L/S is in a range from about 10 μm/about 10 μm to about 20 μm/about 20 μm) is designed to be disposed at a single layer on the "chip side". However, an I/O count and trace routing may be limited. In some embodiments (e.g., as shown in FIG. 1), the first circuit layer 14 and the second circuit layer 18 are different layers and may include the fine line structures (e.g., an L/S in a range from about 10 μm/about 10 μm to about 20 μm/about 20 μm, or less than about 7 μm/about 7 μm), and thus, the I/O count may be increased and flexibility of trace routing may be enhanced.

In addition, the first circuit layer 14 and the third circuit layer 22 may be formed by SAP or MSAP (and the third circuit layer 22 may be formed by a subtractive process), whereas the second pattern (e.g., the first openings 165 and the second openings 166 of the second pattern of the second dielectric structure 16) may be formed by exposure, which results in a more precise width and more flexibility in pattern design. Furthermore, a side surface 183 of the second circuit layer 18 is protected by the second dielectric structure 16 and therefore may not be etched. In one or more embodiments of the present disclosure, the second circuit layer 18 may be formed by electrolytic etching, and thus, there may be no excess amount of the second circuit layer 18 to be removed, and a surface roughness value of the first surface 141 of the first circuit layer 14 may be different from a surface roughness value of the first surface 181 of the second circuit layer 18. Thus, the second circuit layer 18 includes fine lines, and is available for fine I/O pitch and more I/O connections, especially when a bump pad pitch (e.g., a pitch between the conductive posts 185) is less than or equal to about 90 μm.

Figure 6:
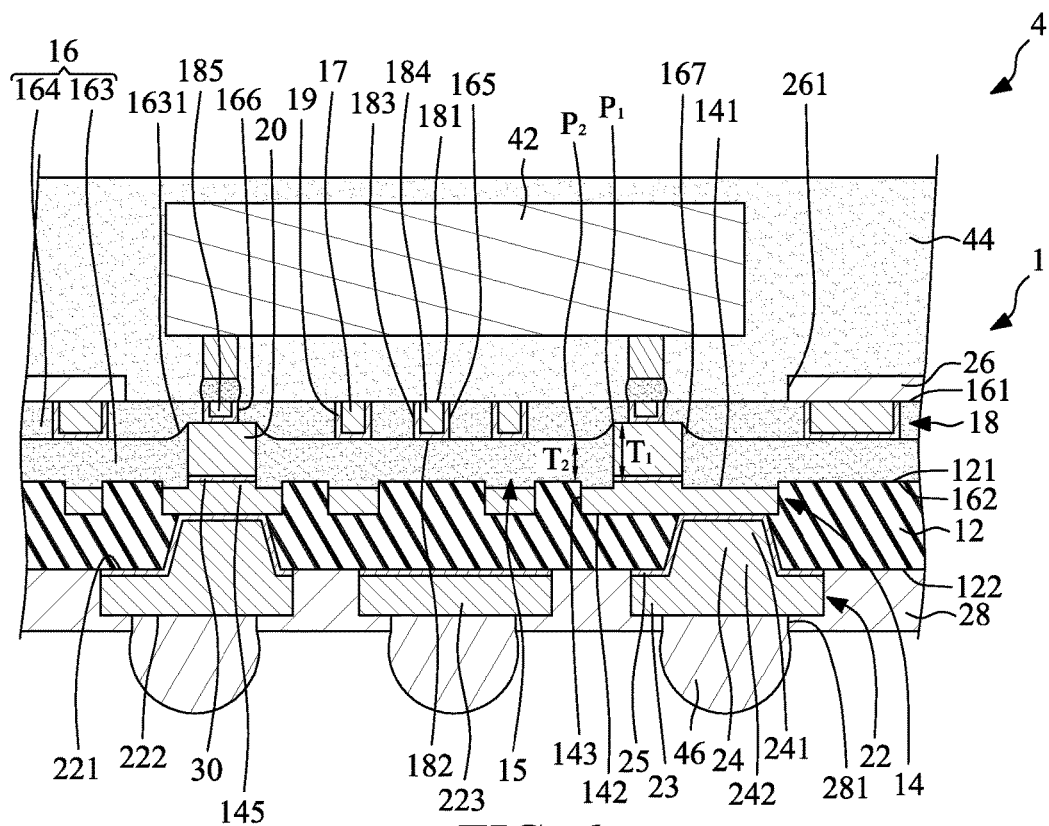
FIG. 6 illustrates a cross-sectional view of a semiconductor package structure according to some embodiments of the present disclosure.

As shown in FIG. 1, a gap between the conductive post 185 and the conductive trace 184 is greater than a gap between the conductive pillar 20 and the conductive trace 184. Thus, when a solder on a pillar of a semiconductor die 42 (e.g., as shown in FIG. 6) is bonded to the conductive post 185 of the substrate 1, the greater gap between the conductive post 185 and the conductive trace 184 can prevent the solder from contacting the conductive trace 184 so as to reduce a risk of bridge.

Figure 2:
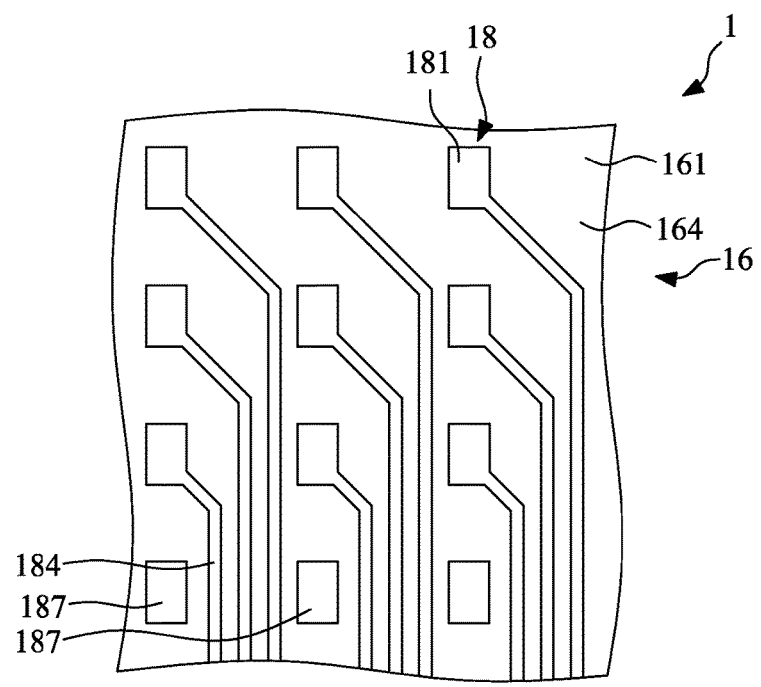
FIG. 2 illustrates a top view of a portion of the substrate shown in FIG. 1 not including the conductive pillars according to some embodiments of the present disclosure.

FIG. 2 illustrates a top view of a portion of the substrate 1 not including the conductive pillars 20 according to some embodiments of the present disclosure. Bump pads 187 of the second circuit layer 18 are arranged in an array. The conductive traces 184 are connected to respective ones of the bump pads 187, and routed between the bump pads 187. In some embodiments, there are three conductive traces 184 between the bump pads 187. It is noted that the L/S of the conductive traces 184 is determined by a gap between the bump pads 187 and a number of the conductive traces 184 that are disposed in such a gap.

Figure 3:
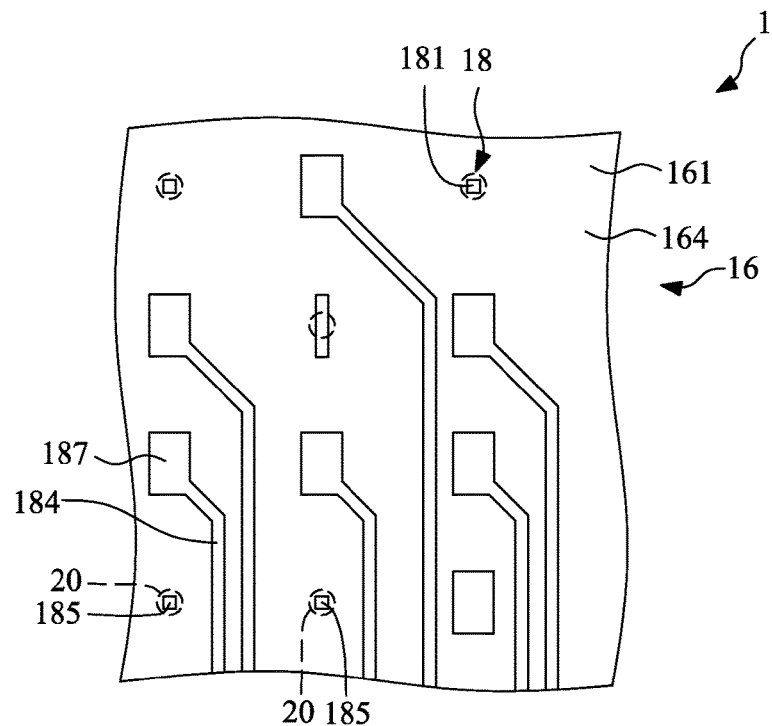
FIG. 3 illustrates a top view of a portion of the substrate shown in FIG. 1 including the conductive pillars according to some embodiments of the present disclosure.

FIG. 3 illustrates a top view of a portion of the substrate 1 including the conductive pillars 20 according to some embodiments of the present disclosure. Some of the bump pads 187 of the second circuit layer 18 are replaced by the conductive posts 185 which are connected to the conductive pillars 20 for electrical and vertical connection. Thus, such conductive posts 185 may not be connected to a conductive trace 184. In some embodiments, there are two conductive traces 184 between the conductive posts 185. In some embodiments (e.g., as shown in FIG. 2), a number of the conductive traces 184 may be reduced. Therefore, flexible circuit design for the L/S under the same bump pad pitch (or conductive post pitch) may be available, and more space in the gaps between the bump pads (or conductive posts) may be available to enhance design flexibility. In addition, as shown in FIG. 3, some of the conductive posts 185 may be disposed within an area defined by a respective one of the conductive pillars 20, and some of the conductive posts 185 may extend outside an area defined by a respective one of the conductive pillars 20. In some embodiments, the sizes and shapes of the conductive posts 185 may be the same as the sizes and shapes of the bump pads 187. In some embodiments, the conductive post 185 may be rectangular or circular.

Figure 4:
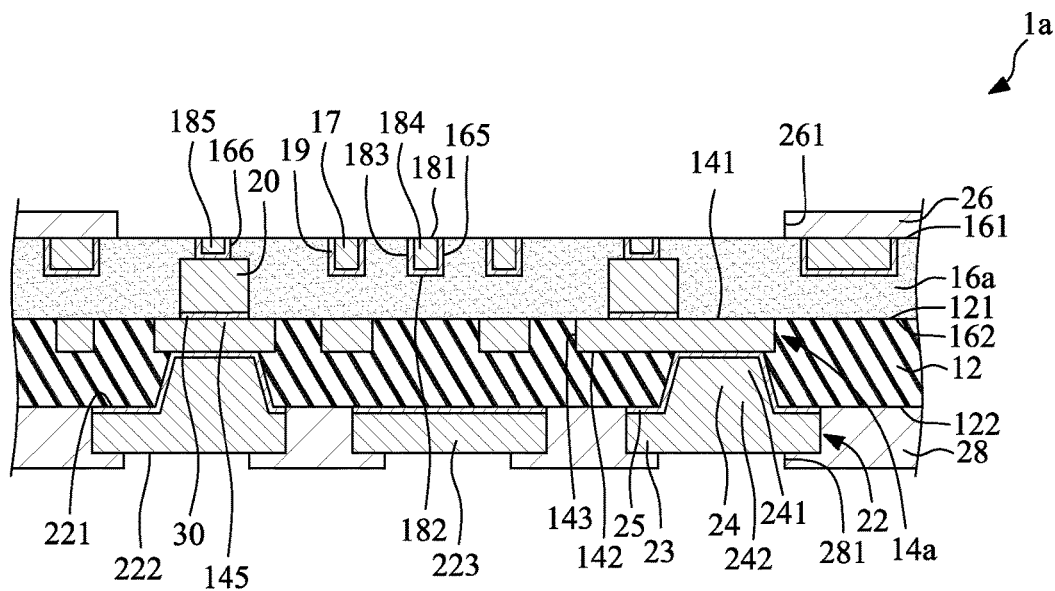
FIG. 4 illustrates a cross-sectional view of a substrate according to some embodiments of the present disclosure.

FIG. 4 illustrates a cross-sectional view of a substrate 1a according to some embodiments of the present disclosure. The substrate 1a is similar in certain respects to the substrate 1 as shown in FIG. 1, except for some differences including different structures of a second dielectric structure 16a and first circuit layer 14a as compared to the second dielectric structure 16 and the first circuit layer 14 shown in FIG. 1, respectively. In some embodiments, the second dielectric structure 16a may be a single layer structure which includes only one dielectric layer. Thus, the interface (e.g., the first surface 1631 of the first dielectric layer 163) of FIG. 1 is omitted. In addition, the first surface 141 of the first circuit layer 14 may be coplanar with the first surface 121 of the first dielectric structure 12. Thus, the recess portion 15 of FIG. 1 is omitted.

Figure 5:
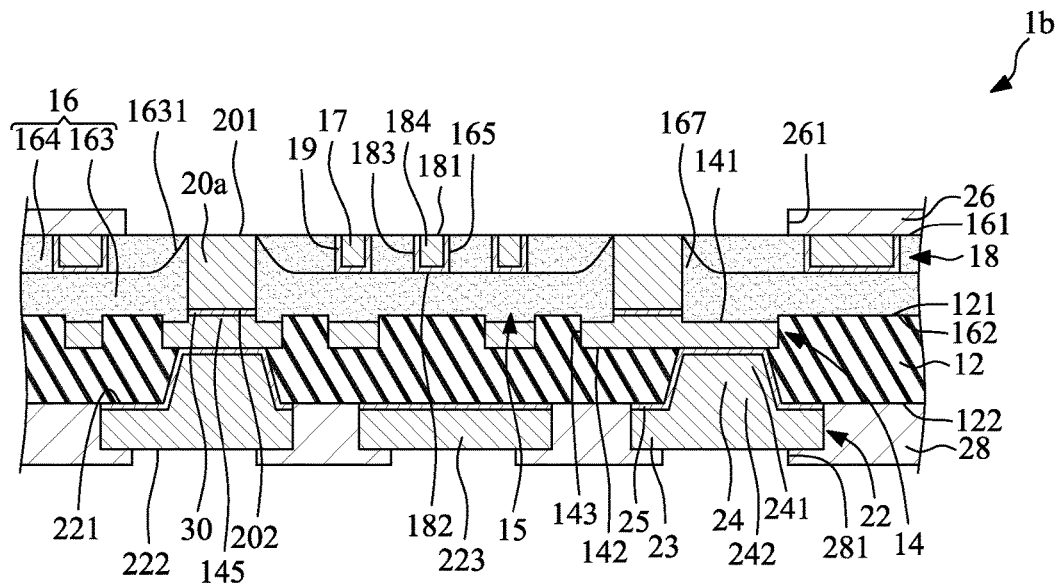
FIG. 5 illustrates a cross-sectional view of a substrate according to some embodiments of the present disclosure.

FIG. 5 illustrates a cross-sectional view of a substrate 1b according to some embodiments of the present disclosure. The substrate 1b is similar in certain respects to the substrate 1 as shown in FIG. 1, except for some differences including different structures of conductive pillars 20a as compared to the conductive pillars 20 shown in FIG. 1. An end (e.g., first end 201) of each of the conductive pillars 20a is exposed from the first surface 161 of the second dielectric structure 16 for external connection, and the other end (e.g., second end 202) of each of the conductive pillars 20a connects the first circuit layer 14. Therefore, the first end 201 of each of the conductive pillars 20a can serve as a landless via. As compared with FIG. 1, a length of the conductive pillar 20a of FIG. 5 is greater than a length of the conductive pillar 20 of FIG. 1. As shown in FIG. 5, each of the conductive pillars 20a extends through the second dielectric structure 16, and the first end 201 of each of the conductive pillars 20a is substantially coplanar with the first surface 161 of the second dielectric structure 16.

FIG. 6 illustrates a cross-sectional view of a semiconductor package structure 4 according to some embodiments of the present disclosure. The semiconductor package structure 4 includes the substrate 1, a semiconductor die 42, an encapsulant 44 and a plurality of external connectors 46. The substrate 1 shown in FIG. 6 is the same as the substrate 1 shown in FIG. 1. However, in some embodiments, the substrate 1 shown in FIG. 6 may be replaced by the substrate 1a or 1b. The semiconductor die 42 is electrically connected to the conductive posts 185 of the second circuit layer 18 in the opening 261 of the first protection layer 26. The encapsulant 44 covers the semiconductor die 42 and a top surface of the substrate 1. In some embodiments, the encapsulant 44 covers the first protection layer 26. The encapsulant 44 may be formed with an encapsulation material such as an epoxy molding compound (EMC), PI, a phenolic, a silicone, or any other suitable encapsulation material. The external connectors 46 are attached or coupled to the exposed portions (e.g., the ball pads 223) of the third circuit layer 22 in the openings 281 of the second protection layer 28.

Figure 7:
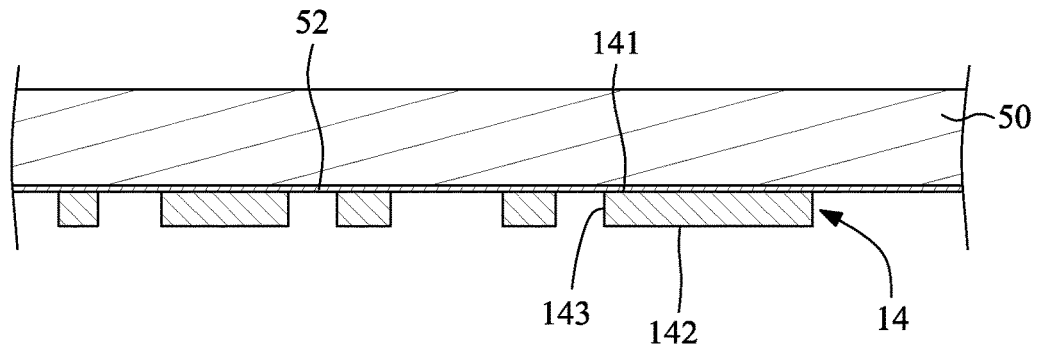
FIG. 7, FIG. 8, FIG. 9, FIG. 10, FIG. 11, FIG. 12, FIG. 13, FIG. 14, FIG. 15, FIG. 16, FIG. 17, FIG. 18 and FIG. 19 illustrate a manufacturing process for manufacturing a substrate according to some embodiments of the present disclosure.

FIGS. 7 to 19 illustrate a manufacturing process for manufacturing a substrate according to some embodiments of the present disclosure. Referring to FIG. 7, a carrier 50 and a metal foil 52 are provided. The metal foil 52 is disposed on a surface of the carrier 50. Although a manufacturing process performed on one side of the carrier 50 is shown, it is understood that the manufacturing process may be performed on the other side of the carrier 50 in a similar manner. For example, the manufacturing process may be performed on both sides of the carrier 50.

Then, the first circuit layer 14 is formed or disposed on the metal foil 52, for example by a plating technique. The first circuit layer 14 includes the first surface 141, the second surface 142 opposite to the first surface 141, and the side surface 143 extending between the first surface 141 and the second surface 142. A material of the first circuit layer 14 may be a conductive first metal such as copper, and a thickness thereof may be greater than about 10 µm (e.g., may be about 15 µm). In addition, the side surface 143 and the second surface 142 of the first circuit layer 14 may be treated with a brown oxide treatment to facilitate a lamination process of the first dielectric structure 12 (e.g., in FIG. 8), thus, a surface roughness value of the second surface 142 and the side surface 143 of the first circuit layer 14 may be in a range of about 0.25 µm to about 0.5 µm. In addition, the L/S of the first circuit layer 14 may be greater than about 7 µm/about 7 µm.

Figure 8:
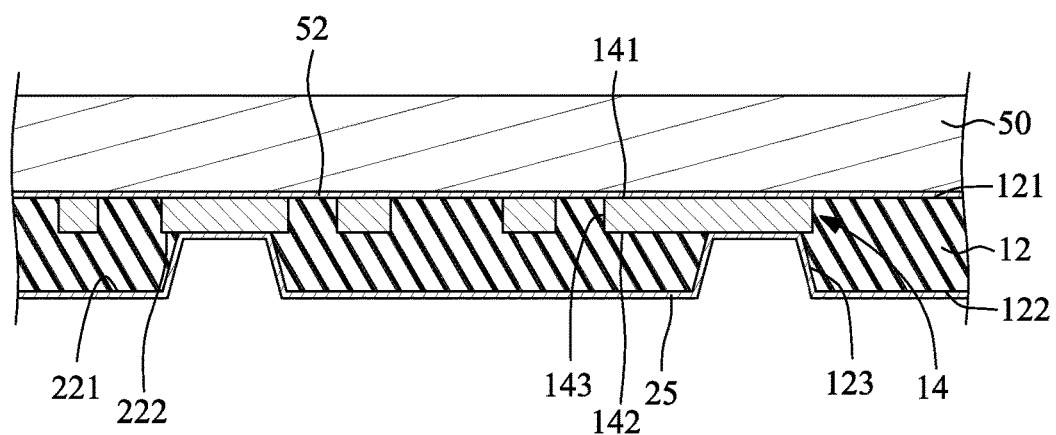

Referring to FIG. 8, the first dielectric structure 12 is formed or disposed (e.g., stacked or laminated) on the metal foil 52 to cover the first circuit layer 14. The first dielectric structure 12 may be a dielectric layer which may be, or may include, for example, a monocrystalline silicon, a polycrystalline silicon, an amorphous silicon, other suitable materials, or a combination thereof. The first dielectric structure 12 may be, or may include, for example, a sheet made from pre-impregnated composite fibers. For example, the first dielectric structure 12 may include a cured fiber reinforced resin. A thickness of the first dielectric structure 12 may be, for example, about 40 µm. The first dielectric structure 12 includes a first surface 121 and a second surface 122 opposite to the first surface 121.

The first surface 141 of the first circuit layer 14 is substantially coplanar with the first surface 121 of the first dielectric structure 12. For example, the first dielectric structure 12 may not cover the first surface 141 of the first circuit layer 14. Accordingly, in some embodiments, a wiring structure is formed or disposed on the carrier 50, wherein the wiring structure includes the first dielectric structure 12 and the first circuit layer 14 embedded in the first dielectric structure 12.

Then, a plurality of openings 123 are formed on the second surface 122 of the first dielectric structure 12 to expose a portion of the second surface 142 of the first circuit layer 14. Then, a third seed layer 25 is formed or disposed on the second surface 122 and the openings 123 of the first dielectric structure 12.

Figure 9:
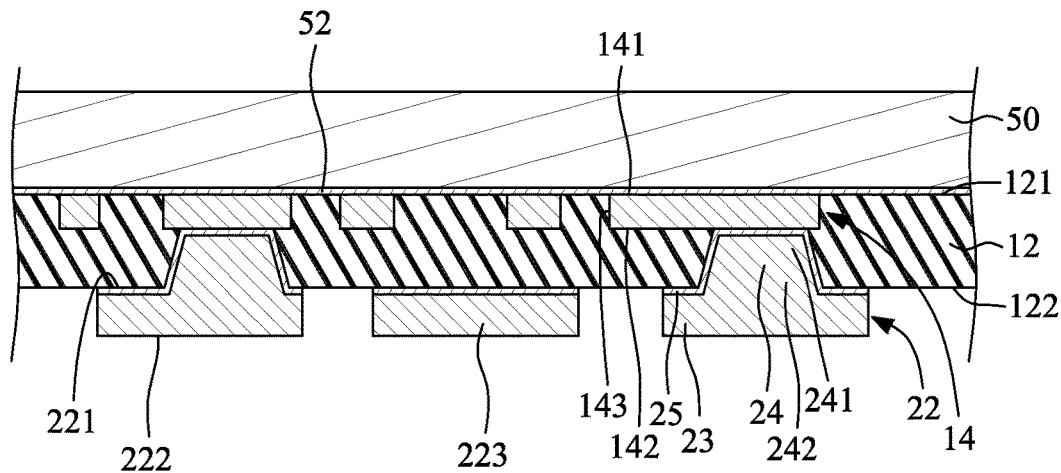

Referring to FIG. 9, a conductive material (e.g., the conductive third metal 23) is formed or disposed on the third seed layer 25. Thus, the conductive material (e.g., the conductive third metal 23) is formed or disposed on the second surface 122 and the openings 123 of the first dielectric structure 12. Then, the conductive material (e.g., the conductive third metal 23) and the third seed layer 25 on the second surface 122 of the first dielectric structure 12 are patterned to form the third circuit layer 22. The conductive material (e.g., the conductive third metal 23) and the third seed layer 25 in the openings 123 of the first dielectric structure 12 form the conductive vias 24. Each of the conductive vias 24 includes a first portion 241 connecting the first circuit layer 14 and a second portion 242 connecting the third circuit layer 22. A width of the first portion 241 of the conductive via 24 is less than a width of the second portion 242 of the conductive via 24. In one or more embodiments, the conductive vias 24 and the third circuit layer 22 are formed integrally with each other (e.g., formed concurrently with each other).

Figure 10:
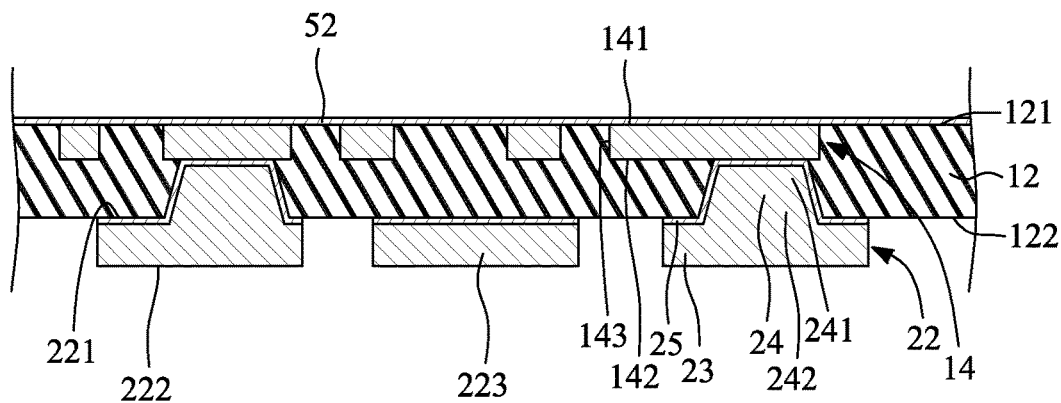

Referring to FIG. 10, the carrier 50 is removed from the metal foil 52.

Figure 11:
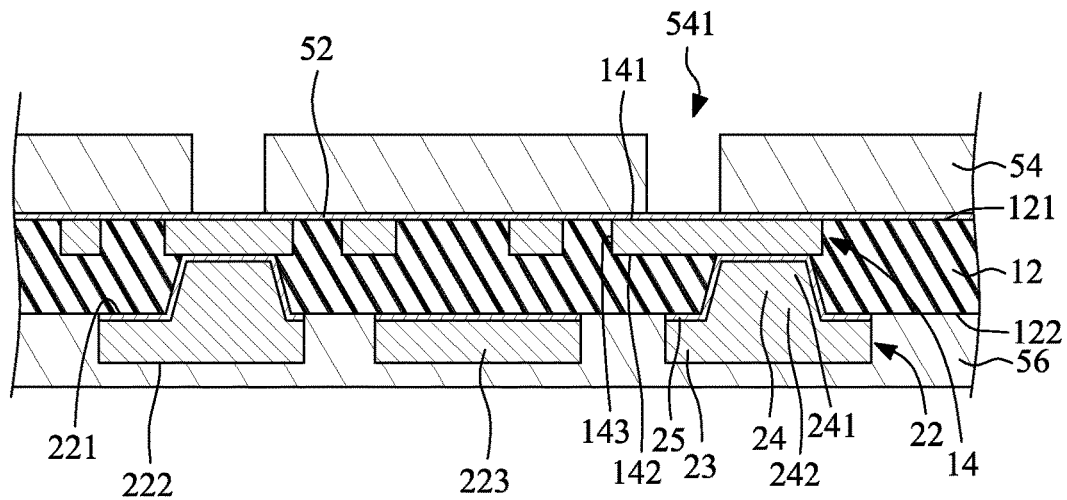

Referring to FIG. 11, a first photoresist layer 54 is formed or disposed on the metal foil 52 and defines a plurality of openings 541 to expose portions of the metal foil 52. A second photoresist layer 56 is formed or disposed on the second surface 122 of the first dielectric structure 12 to cover the third circuit layer 22.

Figure 12:
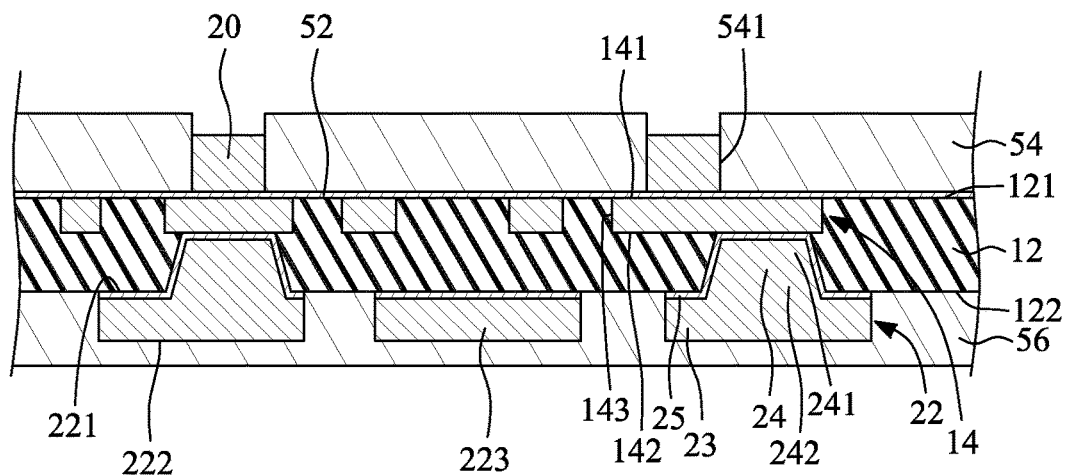

Referring to FIG. 12, a conductive material (e.g., conductive metal) is formed or disposed on the metal foil 52 in the openings 541 of the first photoresist layer 54, for example by a plating technique, to form a plurality of conductive pillars 20 on the metal foil 52 on the first circuit layer 14.

Figure 13:
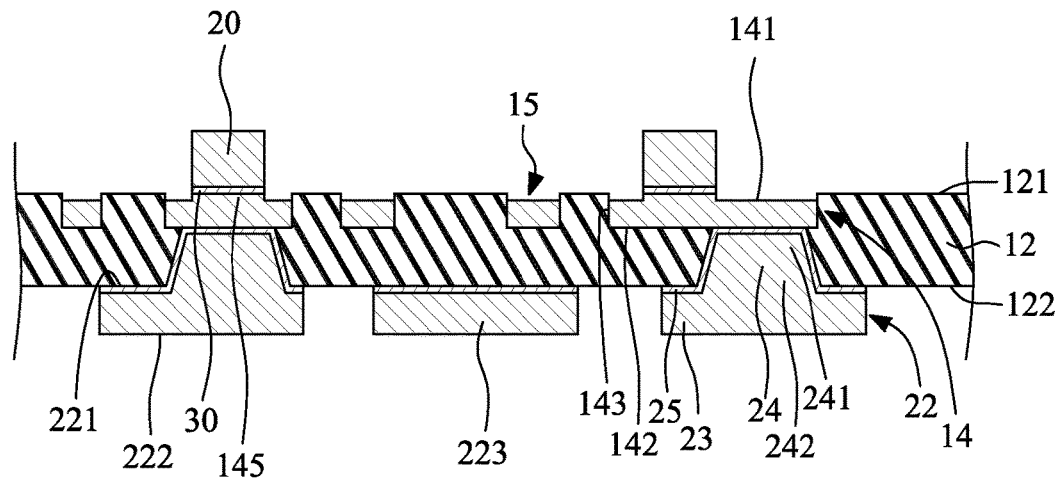

Referring to FIG. 13, the first photoresist layer 54 and the second photoresist layer 56 are removed by, for example, stripping. Then, the metal foil 52 that is not covered by the conductive pillars 20 are removed by, for example, etching. Thus, a portion (e.g., the first surface 141) of the first circuit layer 14 is exposed from the first surface 121 of the first dielectric structure 12. For example, the first circuit layer 14 does not protrude from the first surface 121 of the first dielectric structure 12. In some embodiments, the first surface 141 of the first circuit layer 14 may be over etched, thus, the first circuit layer 14 is recessed from the first surface 121 of the first dielectric structure 12, and a distance may be formed between the first surface 141 of the first circuit layer 14 and the first surface 121 of the first dielectric structure 12, so that the recess portion 15 is formed above the first surface 141 of the first circuit layer 14 and under the first surface 121 of the first dielectric structure 12, and the protrusion portions 145 protruding from the first surface 141 of the first circuit layer 14 and corresponding to the conductive pillars 20 are also formed. In addition, a surface roughness value of the first surface 141 of the first circuit layer 14 may be greater than about 0.4 µm due to the etching process. The portions of the metal foil 52 under the conductive pillars 20 may not be etched and may become the intermediate layer 30. For example, the intermediate layer 30 is interposed between the protrusion portion 145 and the conductive pillar 20. The widths of the conductive pillar 20, the intermediate layer 30 and the protrusion portion 145 are substantially equal to each other so as to form a pillar structure.

Figure 14:
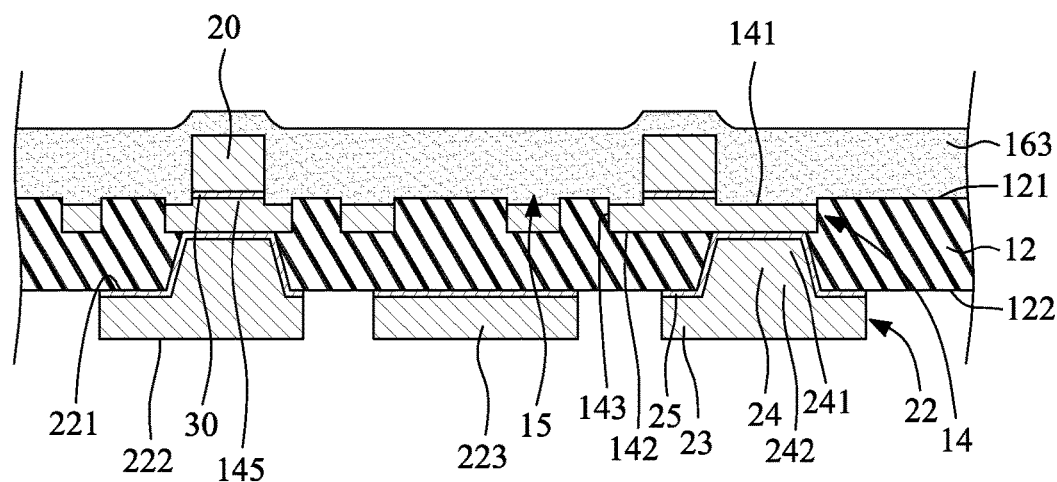

Referring to FIG. 14, the first dielectric layer 163 is formed or disposed to cover the first surface 121 of the first dielectric structure 12, the first surface 141 of the first circuit layer 14 and the conductive pillars 20. A portion of the first dielectric layer 163 extends into the recess portion 15 above the first surface 141 of the first circuit layer 14. The first dielectric layer 163 may include a PID material such as epoxy or PI including photoinitiators. Then, the first dielectric layer 163 is cured.

Figure 15:
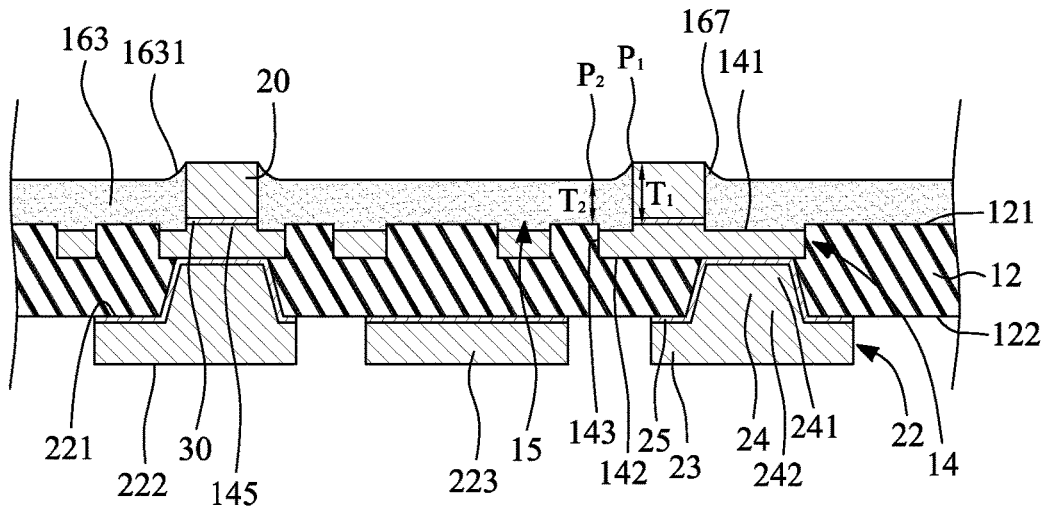

Referring to FIG. 15, the first dielectric layer 163 is thinned so as to expose a top end of the conductive pillar 20. The thinning process may be a dry process such as a plasma process, or a wet process such as a desmear process. After the thinning process, the first surface 1631 of the first dielectric layer 163 is not an even surface. The first dielectric layer 163 has a first thickness $T_1$ at a first position $P_1$ and a second thickness $T_2$ at a second position $P_2$. The first position $P_1$ is closer to the conductive pillar 20 than the second position $P_2$, and the first thickness $T_1$ is greater than the second thickness $T_2$. For example, $T_1$ may be greater than about 1.1 times $T_2$ (e.g., about 1.2 times greater or more or about 1.3 times greater or more). Thus, the first dielectric layer 163 includes a plurality of protrusion portions 167, and each of the protrusion portions 167 surrounds a respective one of the conductive pillars 20. A thickness of the protrusion portion 167 decreases with increasing distance from the conductive pillar 20.

Figure 16:
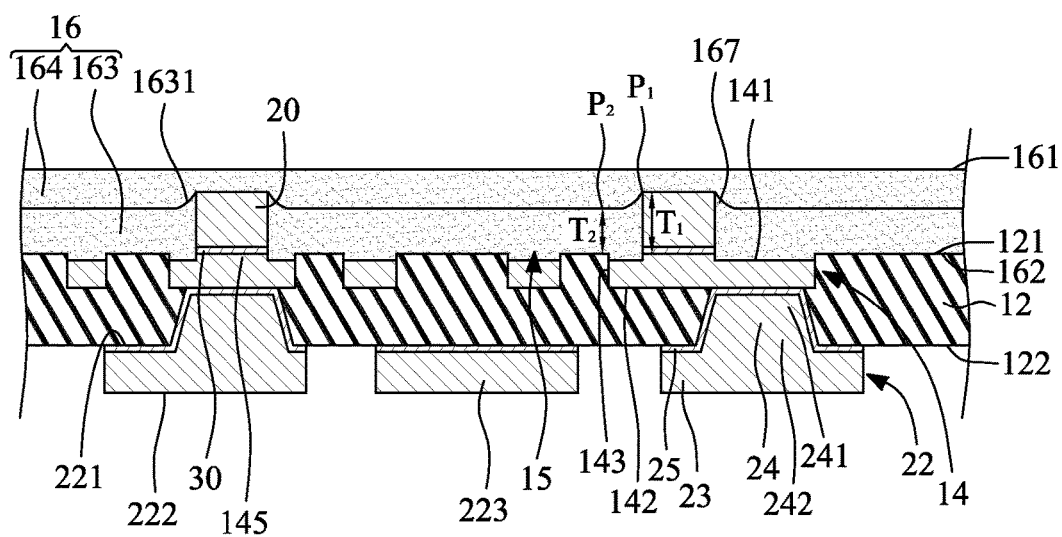

Referring to FIG. 16, the second dielectric layer 164 is formed or disposed to cover the first dielectric layer 163 and the conductive pillars 20 so as to form or dispose the second dielectric structure 16 on the wiring structure, in which the second dielectric structure 16 covers the conductive pillars 20. The second dielectric layer 164 may include a PID material such as epoxy or PI including photoinitiators. It is noted that the material of the second dielectric layer 164 may be the same as or different from the material of the first dielectric layer 163. Then, the second dielectric layer 164 is cured.

Figure 17:
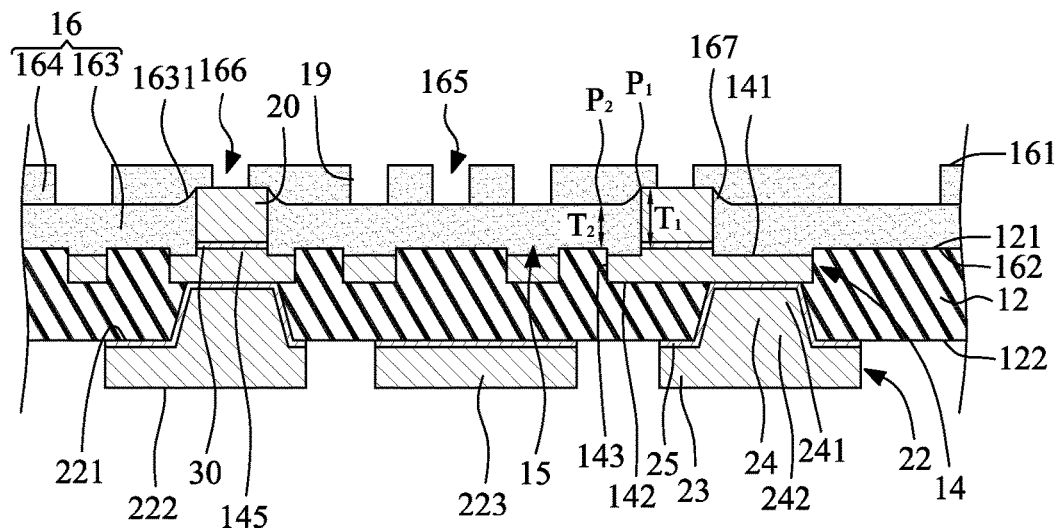

Referring to FIG. 17, the plurality of first openings 165 and the plurality of second openings 166 are formed on the first surface 161 of the second dielectric layer 164 by, for example, a photolithography process (e.g., including exposure and development) to form the second pattern. The first openings 165 and the second openings 166 extend through the second dielectric layer 164, and the second openings 166 expose the conductive pillars 20. Since the second pattern (e.g., the first openings 165 and the second opening 166) may be formed by exposure, a more precise width and more flexibility in pattern design can be achieved. In some embodiments, a depth of the first opening 165 is greater than a depth of the second opening 166.

Figure 18:
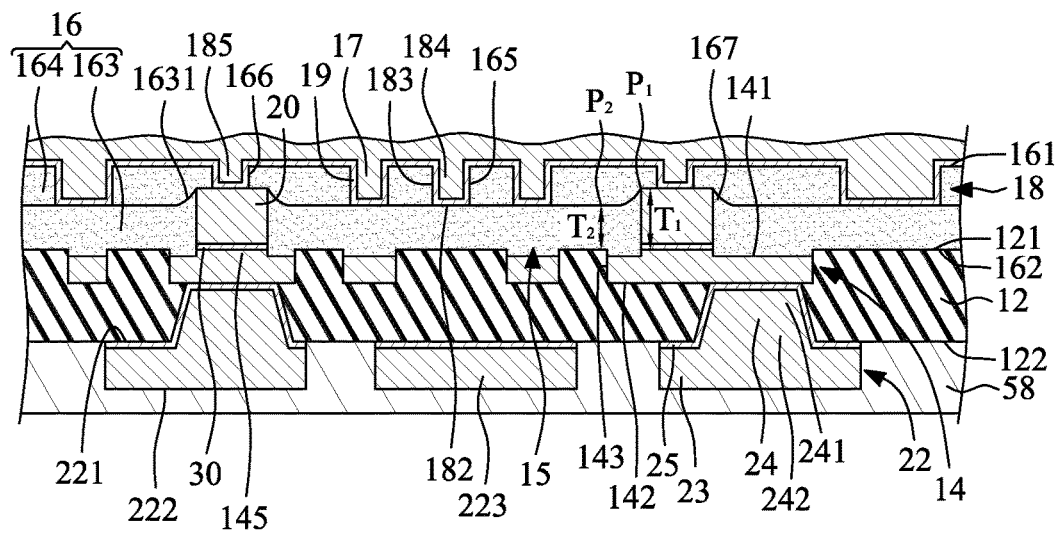

Referring to FIG. 18, a third photoresist layer 58 is formed or disposed on the second surface 122 of the first dielectric structure 12 to cover the third circuit layer 22. Then, a second seed layer 19 is formed or disposed in the first openings 165, the second openings 166 and on a top surface of the second dielectric layer 164 (e.g., the first surface 161 of the second dielectric structure 16). Then, the conductive second metal 17, such as copper, is formed or disposed (e.g., plated) on the second seed layer 19 to fill the first openings 165 and the second openings 166. The conductive second metal 17 is also formed or disposed on the top surface of the second dielectric layer 164 (e.g., the first surface 161 of the second dielectric structure 16). In some embodiments, a top surface of the conductive second metal 17 may be uneven. For example, the portion of the conductive second metal 17 on the first surface 161 of the second dielectric structure 16 may not have a consistent thickness.

Figure 19:
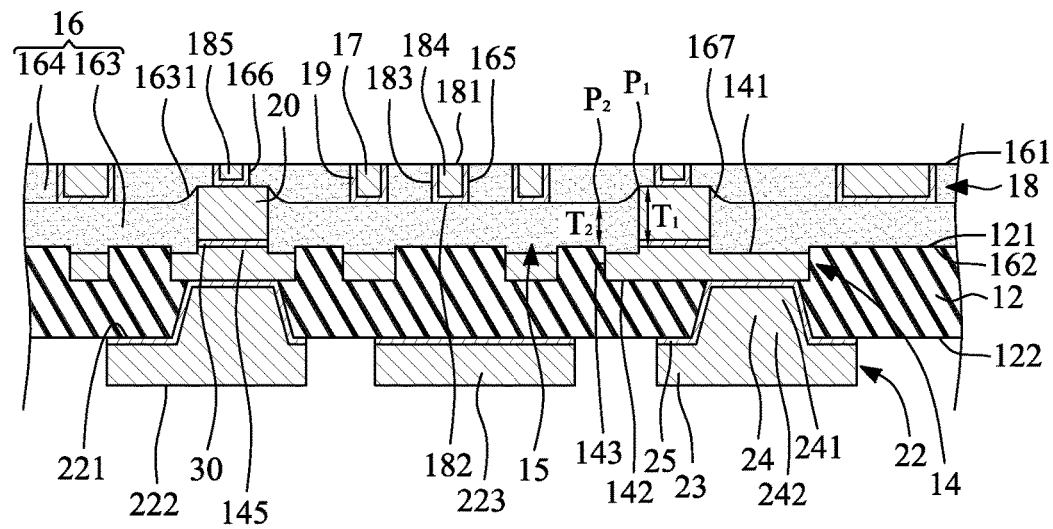

Referring to FIG. 19, excess second seed layer 19 and conductive second metal 17 on the top surface of the second dielectric layer 164 (e.g., the first surface 161 of the second dielectric structure 16) are removed by electrolytic etching, so as to form the second circuit layer 18. The electrolytic etching is also known as electro-etching or anodic etching. The electrolytic etching may be performed by disposing an object to be etched (e.g., the conductive second metal 17) in an electrolysis solution, and a flat plate electrode is provided above the object to be etched (e.g., the conductive second metal 17). Then, the object to be etched (e.g., the conductive second metal 17) is electrically connected to a positive pole of a power supply, and is used as the anode. The flat plate electrode is electrically connected to a negative pole of a power supply, and is used as the cathode. When the power supply is turned on, the positive ions of the object to be etched (e.g., the conductive second metal 17) such as copper from the electrolysis solution move towards the cathode, while the negative ions of the electrolysis solution move towards the anode. As shown in FIG. 17, the top surface of the conductive second metal 17 may be uneven. For example, the conductive second metal 17 may have protruding portions and recess portions. During the initial stage of the etching process, the protruding portions of the conductive second metal 17 may be etched first because a distance between the protruding portions of the conductive second metal 17 and the flat plate electrode is relative short, which results in less electrical resistance. After being etched for a while, the conductive second metal 17 will be removed evenly, and the surface will be smooth.

In some embodiments, the side surface 183 of the second circuit layer 18 is protected by the second dielectric structure 16 and therefore may not be etched. The second circuit layer 18 includes the plurality of conductive traces 184 disposed in the first openings 165 and the plurality of conductive posts 185 disposed in the second openings 166. The conductive traces 184 and the conductive posts 185 are exposed from the top surface of the second dielectric layer 164 (e.g., the first surface 161 of the second dielectric structure 16), and a thickness of the conductive trace 184 is less than a thickness of the conductive post 185. Each of the conductive posts 185 is disposed on a respective one of the conductive pillars 20.

In one or more embodiments of the present disclosure, the excess second seed layer 19 and conductive second metal 17 are removed by electrolytic etching, thus, there may be no excess amount of the second circuit layer 18 to be removed, and a surface roughness value of the first surface 141 of the first circuit layer 14 may be different from a surface roughness value of the first surface 181 of the second circuit layer 18. In some embodiments, a surface roughness value of the first surface 181 of the second circuit layer 18 may be, for example, in a range of about 0.2 µm to about 0.4 µm, a surface roughness value of the side surface 183 of the second circuit layer 18 may be less than or equal to about 0.1 µm. Furthermore, the first surface 181 of the second circuit layer 18 may be substantially coplanar with the top surface of the second dielectric layer 164 (e.g., the first surface 161 of the second dielectric structure 16). The second circuit layer 18 is electrically connected to the first circuit layer 14 through the conductive pillars 20. Then, the third photoresist layer 58 is removed.

Then, the first protection layer 26 is formed or disposed on the top surface of the second dielectric layer 164 (e.g., the first surface 161 of the second dielectric structure 16), and the second protection layer 28 is formed or disposed on the second surface 122 of the first dielectric structure 12. The first protection layer 26 defines at least one opening 261 to expose a portion or portions (e.g., the conductive posts 185) of the second circuit layer 18, and the second protection layer 28 defines at least one opening 281 to expose a portion or portions (e.g., the ball pads 223) of the third circuit layer 22. Accordingly, in some embodiments, the substrate 1 (e.g., as shown in FIG. 1) is manufactured.

In some embodiments, the manufacturing process may further include the following stages. The semiconductor die 42 is electrically connected to the exposed portion (e.g., the conductive post 185) of the first circuit layer 14 in the opening 261 of the first protection layer 26. Then, the encapsulant 44 is formed or disposed to cover the semiconductor die 42 and the surface of the substrate 1. Then, the plurality of external connectors 46 are attached to the exposed portion (e.g., the ball pad 223) of the third circuit layer 22 in the opening 281 of the second protection layer 28. Accordingly, in some embodiments, the semiconductor package structure 4 (e.g., as shown in FIG. 4) is manufactured.

Figure 20:
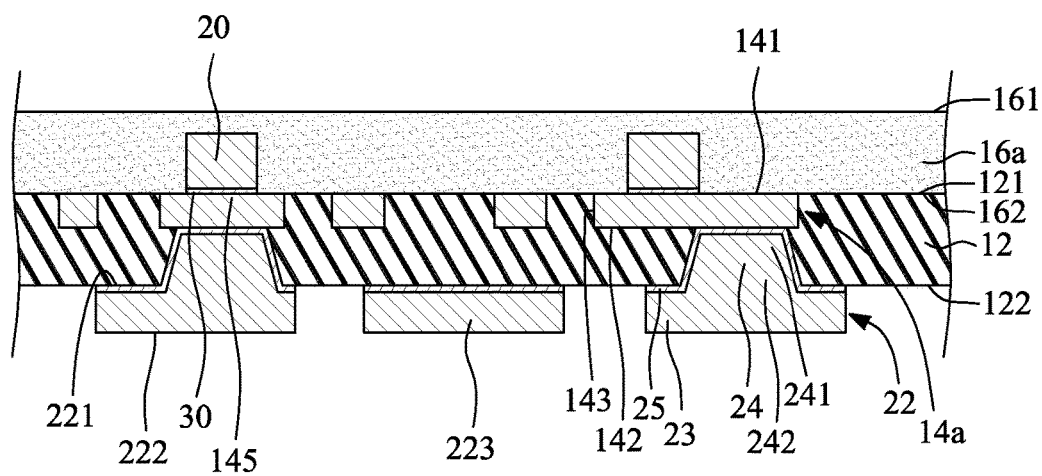
FIG. 20 and FIG. 21 illustrate a manufacturing process for manufacturing a substrate according to some embodiments of the present disclosure.
Figure 21:
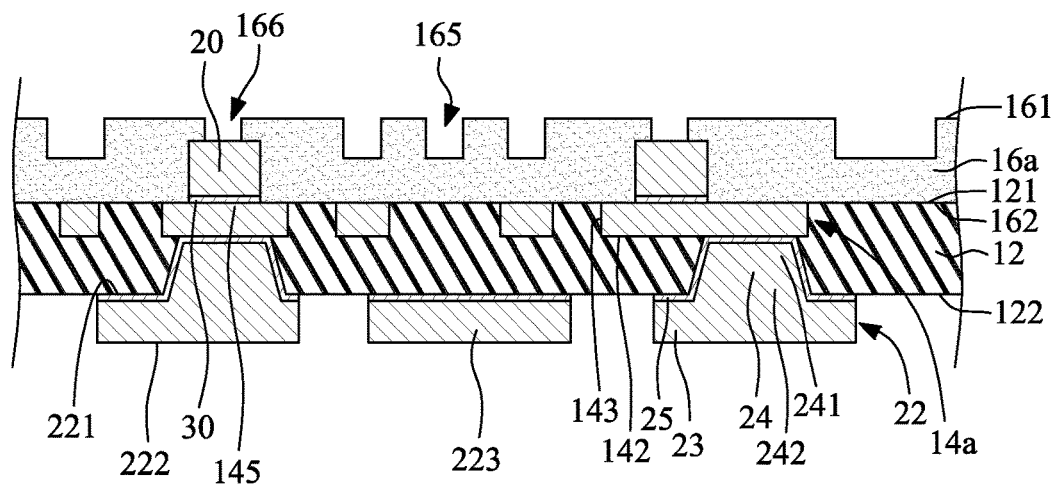

FIGS. 20 to 21 illustrate a manufacturing process for manufacturing a substrate according to some embodiments of the present disclosure. In some embodiments, initial stages are the same as those shown in FIGS. 7 to 12, and the stage shown in FIG. 20 is subsequent to the stage shown in FIG. 12. In some embodiments, the first photoresist layer 54 and the second photoresist layer 56 are removed by, for example, stripping. Then, the metal foil 52 that is not covered by the conductive pillars 20 is removed by, for example, etching. Thus, the first surface 141 of the first circuit layer 14 is exposed from the first surface 121 of the first dielectric structure 12. In some embodiments, the first surface 141 of the first circuit layer 14 may not be over etched, thus, the first circuit layer 14 is substantially coplanar with the first surface 121 of the first dielectric structure 12, so that the recess portions 15 and the protrusion portions 145 (e.g., shown in FIG. 13) will not be formed. In some embodiments, the portions of the metal foil 52 under the conductive pillars 20 will not be etched and will become the intermediate layer 30.

Then, the second dielectric structure 16a is formed or disposed to cover the first surface 121 of the first dielectric structure 12, the first surface 141 of the first circuit layer 14 and the conductive pillars 20. The second dielectric structure 16a may include a PID material such as epoxy or PI including photoinitiators. Then, the second dielectric structure 16a is cured, and includes the first surface 161 and the second surface 162. As shown in FIG. 20, the second dielectric structure 16a is a single layer structure.

Referring to FIG. 21, the plurality of first openings 165 and the plurality of second openings 166 are formed on the first surface 161 of the second dielectric structure 16a by, for example, a photolithography process (e.g., including exposure and development) to form the second pattern. The first openings 165 do not extend through the second dielectric structure 16a, and the second openings 166 expose the conductive pillars 20.

Then, in some embodiments, the following stages are similar to the stages illustrated in FIGS. 18-19 so as to manufacture the substrate 1a (e.g., as shown in FIG. 4).

Figure 22:
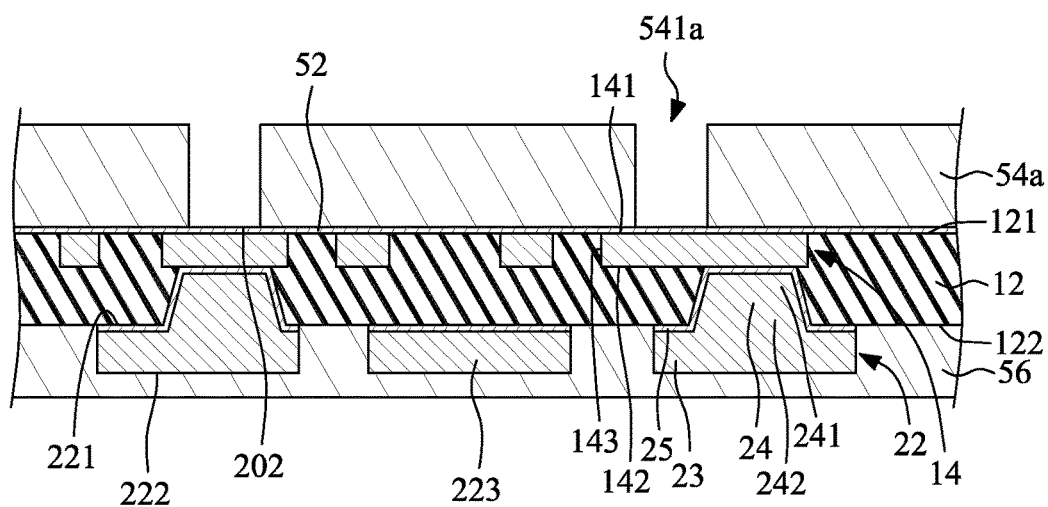
FIG. 22, FIG. 23, FIG. 24, FIG. 25, FIG. 26, FIG. 27 and FIG. 28 illustrate a manufacturing process for manufacturing a substrate according to some embodiments of the present disclosure.

FIGS. 22 to 28 illustrate a manufacturing process for manufacturing a substrate according to some embodiments of the present disclosure. In some embodiments, initial stages are the same as those shown in FIGS. 7 to 10, and the stage shown in FIG. 22 is subsequent to the stage shown in FIG. 10. As shown in FIG. 22, a first photoresist layer 54a is formed or disposed on the metal foil 52 and defines a plurality of openings 541a to expose portions of the metal foil 52. The second photoresist layer 56 is formed or disposed on the second surface 122 of the first dielectric structure 12 to cover the third circuit layer 22. It is noted that a thickness of the first photoresist layer 54a may be greater than a thickness of the first photoresist layer 54 of FIG. 11.

Figure 23:
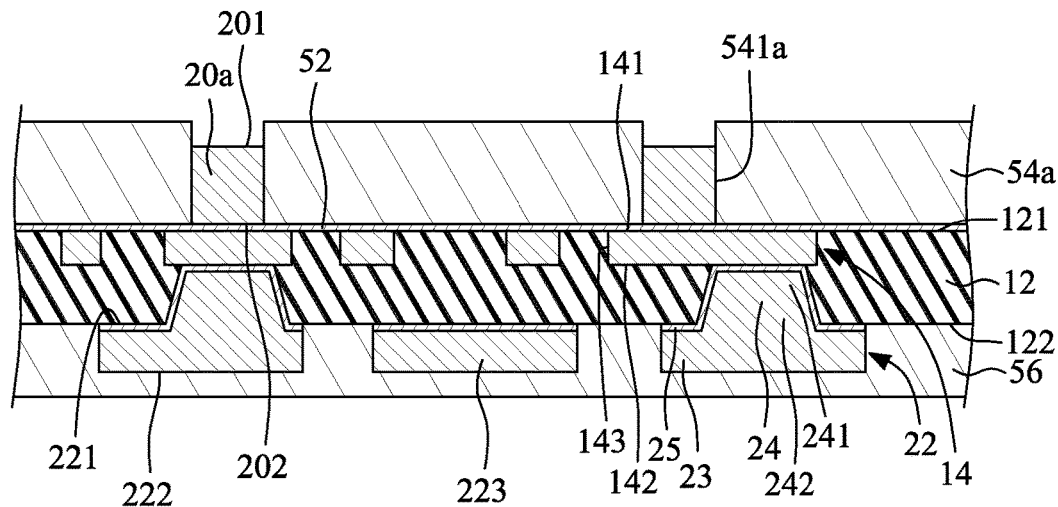

Referring to FIG. 23, a conductive material (e.g., conductive metal) is formed or disposed on the metal foil 52 in the openings 541a of the first photoresist layer 54a, for example, by a plating technique, to form the plurality of conductive pillars 20a on the metal foil 52 on the first circuit layer 14. It is noted that a length of the conductive pillar 20a may be greater than a length of the conductive pillar 20 of FIG. 12.

Figure 24:
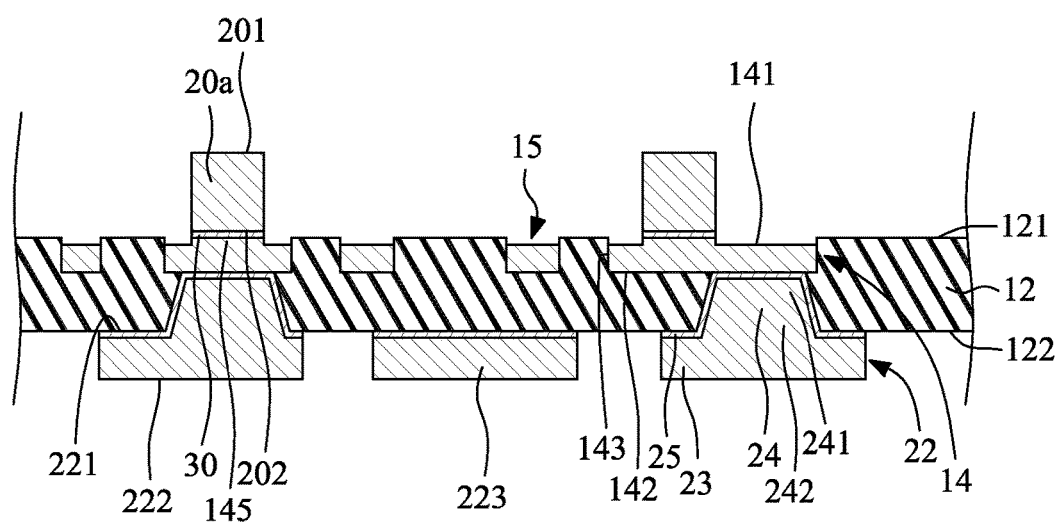

Referring to FIG. 24, the first photoresist layer 54a and the second photoresist layer 56 are removed by, for example, stripping. Then, the metal foil 52 that is not covered by the conductive pillars 20a is removed by, for example, etching. Thus, a portion (e.g., the first surface 141) of the first circuit layer 14 is exposed from the first surface 121 of the first dielectric structure 12. In some embodiments, the first surface 141 of the first circuit layer 14 may be over etched, thus, the first circuit layer 14 is recessed from the first surface 121 of the first dielectric structure 12, so that the recess portion 15 is formed above the first surface 141 of the first circuit layer 14 and under the first surface 121 of the first dielectric structure 12, and the protrusion portions 145 protruding from the first surface 141 of the first circuit layer 14 and corresponding to the conductive pillars 20a are also formed. In some embodiments, the portions of the metal foil 52 under the conductive pillars 20a may not be etched and may become the intermediate layer 30. The conductive pillar 20a includes the first end 201 and the second end 202 connecting the first circuit layer 14 through the intermediate layer 30.

Figure 25:
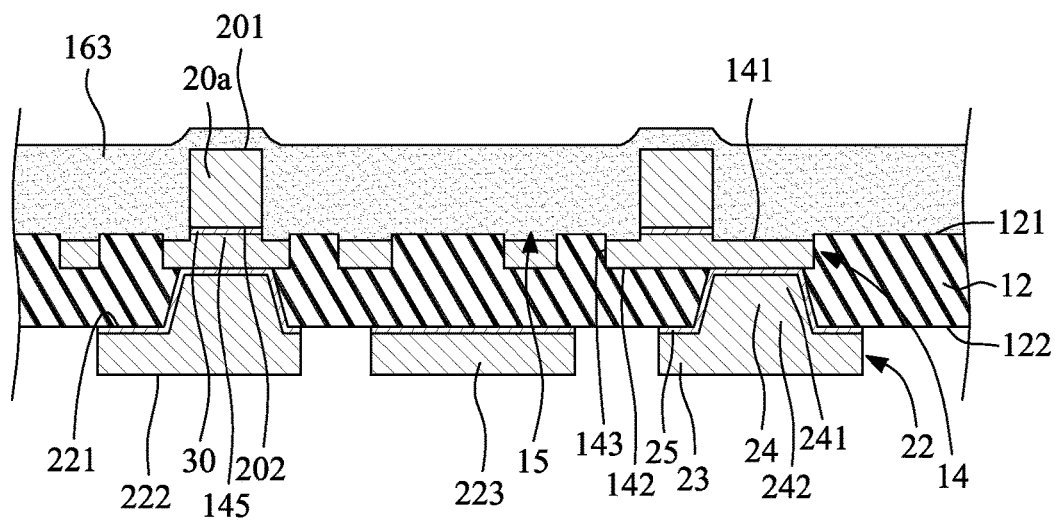

Referring to FIG. 25, the first dielectric layer 163 is formed or disposed to cover the first surface 121 of the first dielectric structure 12, the first surface 141 of the first circuit layer 14 and the conductive pillars 20a. Then, the first dielectric layer 163 is cured.

Figure 26:
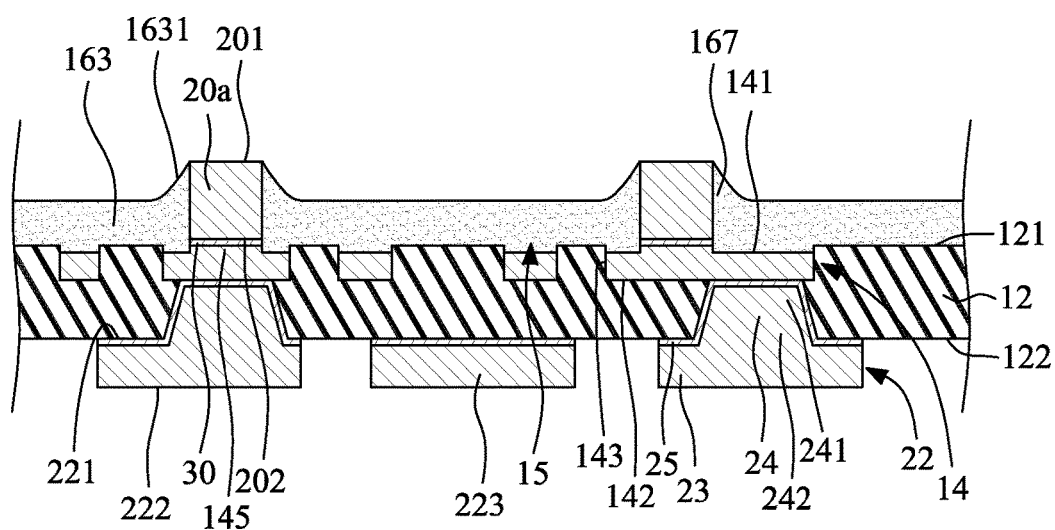

Referring to FIG. 26, the first dielectric layer 163 is thinned so as to expose the first end 201 of the conductive pillar 20a. The thinning process may be a dry process such as plasma process, or a wet process such as desmear process. After the thinning process, the first surface 1631 of the first dielectric layer 163 is not an even surface. Thus, the first dielectric layer 163 includes the plurality of protrusion portions 167, and each of the protrusion portions 167 surrounds a respective one of the conductive pillars 20a.

Figure 27:
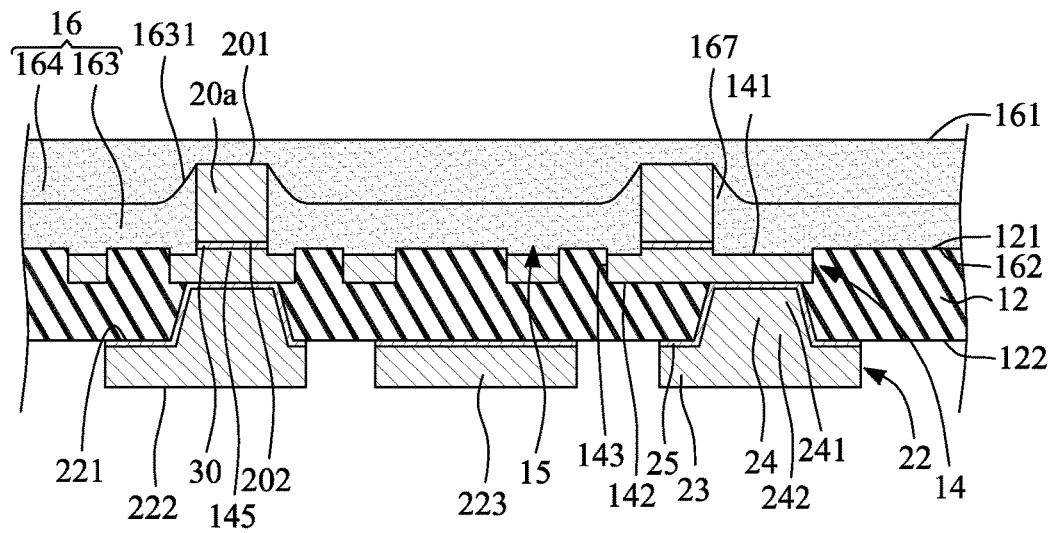

Referring to FIG. 27, the second dielectric layer 164 is formed or disposed to cover the first dielectric layer 163 and the conductive pillars 20a so as to form the second dielectric structure 16. The second dielectric layer 164 may include a PID material such as epoxy or PI including photoinitiators. It is noted that the material of the second dielectric layer 164 may be the same as or different from the material of the first dielectric layer 163. Then, the second dielectric layer 164 is cured.

Figure 28:
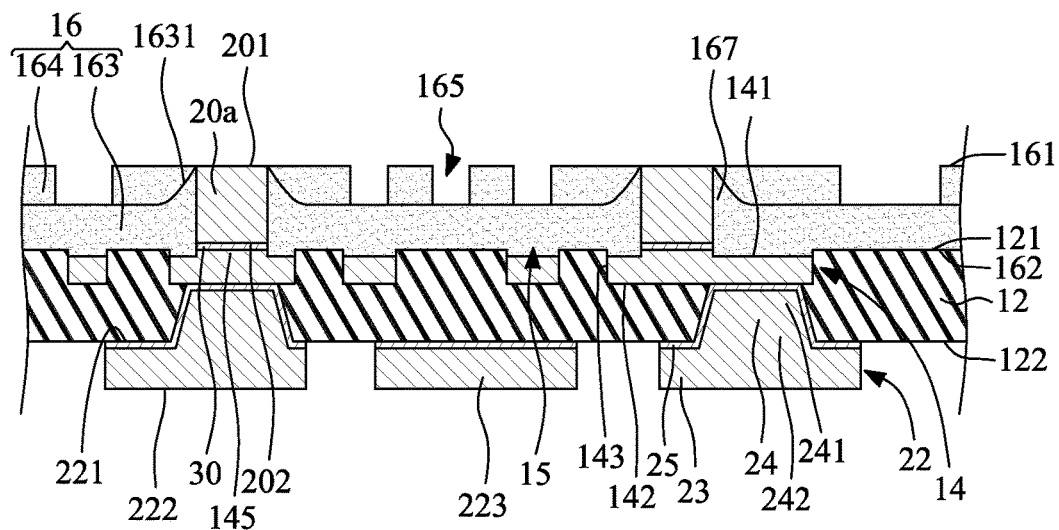

Referring to FIG. 28, the second dielectric layer 164 may be thinned to expose the first end 201 of the conductive pillar 20a. Then, the plurality of first openings 165 are formed on the first surface 161 of the second dielectric layer 164 by, for example, a photolithography process (e.g., including exposure and development) to form the second pattern. The first openings 165 extend through the second dielectric layer 164.

Then, in some embodiments, the following stages are similar to the stages illustrated in FIGS. 18-19 so as to manufacture the substrate 1b (e.g., as shown in FIG. 5).

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such arrangements.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers (μm) of lying along a same plane, such as within 100 within 80 within 60 within 40 within 30 within 20 within 10 or within 1 μm of lying along the same plane. Two surfaces or components can be deemed to be "substantially perpendicular" if an angle therebetween is, for example, 90°±10°, such as ±5°, ±4°, ±3°, ±2°, ±1°, ±0.5°, ±0.1°, or ±0.05°.

Additionally, amounts, ratios, and other numerical values are sometimes presented herein in a range format. It is to be understood that such a range format is used for convenience and brevity and should be understood flexibly to include numerical values explicitly specified as limits of a range, but also to include all individual numerical values or sub-ranges encompassed within that range as if each numerical value and sub-range is explicitly specified.

In the description of some embodiments, a component provided "on" or "over" another component can encompass cases where the former component is directly on (e.g., in physical contact with) the latter component, as well as cases where one or more intervening components are located between the former component and the latter component.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A substrate, comprising:
a first dielectric structure;
a first circuit layer embedded in the first dielectric structure and having a first surface exposed from the first dielectric structure, wherein the first circuit layer does not protrude from a first surface of the first dielectric structure;
a second dielectric structure disposed on the first surface of the first dielectric structure; and
a second circuit layer embedded in the second dielectric structure, wherein the second circuit layer is electrically connected to the first circuit layer, a first surface of the second circuit layer is substantially coplanar with a first surface of the second dielectric structure, and a surface roughness value of the first surface of the first circuit layer is different from a surface roughness value of the first surface of the second circuit layer.

2. The substrate according to claim 1, wherein the surface roughness value of the first surface of the first circuit layer is greater than the surface roughness value of the first surface of the second circuit layer.

3. The substrate according to claim 2, wherein the surface roughness value of the first surface of the first circuit layer is greater than about 0.4 micrometers (μm), and the surface roughness value of the first surface of the second circuit layer is in a range of about 0.2 μm to about 0.4 μm.

4. The substrate according to claim 1, wherein a line width/line space (L/S) of the first circuit layer is greater than about 7 μm/about 7 μm, and an L/S of the second circuit layer is less than about 7 μm/about 7 μm.

5. The substrate according to claim 1, wherein the second dielectric structure comprises a cured photoimageable dielectric (PID) material, and the first dielectric structure comprises a cured fiber reinforced resin.

6. The substrate according to claim 5, wherein a surface roughness value of a side surface of the first circuit layer is greater than a surface roughness value of a side surface of the second circuit layer.

7. The substrate according to claim 1, wherein the second dielectric structure includes a first dielectric layer disposed on the first dielectric structure, and a second dielectric layer disposed on the first dielectric layer.

8. The substrate according to claim 7, wherein a thickness of the second circuit layer is substantially equal to a thickness of the second dielectric layer.

9. The substrate according to claim 1, further comprising a plurality of conductive pillars embedded in the second dielectric structure, wherein each of the conductive pillars connects the first circuit layer and the second circuit layer.

10. The substrate according to claim 9, wherein the second circuit layer includes a plurality of conductive posts exposed from the first surface of the second dielectric structure, and each of the conductive pillars connects the first circuit layer and a respective one of the conductive posts of the second circuit layer.

11. The substrate according to claim 10, wherein the second circuit layer further includes a plurality of conductive traces exposed from the first surface of the second dielectric structure, and a thickness of the conductive trace is less than a thickness of the conductive post.

12. The substrate according to claim 1, further comprising a plurality of conductive pillars embedded in the second dielectric structure, wherein a first end of each of the conductive pillars is exposed from the first surface of the second dielectric structure, and a second end of each of the conductive pillars connects the first circuit layer.

13. The substrate according to claim 1, wherein the first circuit layer is recessed from the first surface of the first dielectric structure so as to form a recess portion above the first surface of the first circuit layer.

14. The substrate according to claim 13, wherein the second dielectric structure extends into the recess portion.

15. A semiconductor package structure, comprising:
a substrate, comprising:
a first dielectric structure;
a first circuit layer embedded in the first dielectric structure and having a first surface exposed from the first dielectric structure, wherein the first circuit layer does not protrude from a first surface of the first dielectric structure;
second dielectric structure disposed on the first surface of the first dielectric structure; and
a second circuit layer embedded in the second dielectric structure, wherein the second circuit layer is electrically connected to the first circuit layer, a first surface of the second circuit layer is substantially coplanar with a first surface of the second dielectric structure, and a surface roughness value of the first surface of the first circuit layer is different from a surface roughness value of the first surface of the second circuit layer;
a semiconductor die electrically connected to the second circuit layer; and
an encapsulant covering the semiconductor die and a surface of the substrate.

16. The semiconductor package structure according to claim 15, wherein the first circuit layer is recessed from the first surface of the first dielectric structure so as to form a recess portion above the first surface of the first circuit layer.

17. The semiconductor package structure according to claim 16, wherein the second dielectric structure extends into the recess portion.

18. The semiconductor package structure according to claim 15, wherein the second dielectric structure comprises a cured PID material, and the first dielectric structure comprises a cured fiber reinforced resin.

19. The semiconductor package structure according to claim 18, wherein a surface roughness value of a side surface of the first circuit layer is greater than a surface roughness value of a side surface of the second circuit layer.

20. The semiconductor package structure according to claim 15, further comprising a plurality of conductive pillars embedded in the second dielectric structure, wherein each of the conductive pillars connects the first circuit layer and the second circuit layer.

21. A substrate, comprising:
a first dielectric structure;
a first circuit layer embedded in the first dielectric structure, wherein the first circuit layer does not protrude from a first surface of the first dielectric structure, and a line width/line space (L/S) of the first circuit layer is greater than about 7 μm/about 7 μm;
a second dielectric structure disposed on the first surface of the first dielectric structure; and
a second circuit layer embedded in the second dielectric structure, wherein the second circuit layer is electrically connected to the first circuit layer, a first surface of the second circuit layer is substantially coplanar with a first surface of the second dielectric structure, a surface roughness value of a first surface of the first circuit layer is different from a surface roughness value of the first surface of the second circuit layer, and an L/S of the second circuit layer is less than about 7 μm/about 7 μm.

* * * * *